(12) United States Patent
Taytsas

(10) Patent No.: US 6,375,822 B1
(45) Date of Patent: Apr. 23, 2002

(54) METHOD FOR ENHANCING THE SOLDERABILITY OF A SURFACE

(76) Inventor: Lev Taytsas, 26 Colley St., Apt. 2-1, Waterbury, CT (US) 06708

( * ) Notice: Subject to any disclaimer, the term of this patent is extended or adjusted under 35 U.S.C. 154(b) by 16 days.

(21) Appl. No.: 09/677,904

(22) Filed: Oct. 3, 2000

(51) Int. Cl.⁷ .................................................. B32K 1/20
(52) U.S. Cl. .................... 205/85; 205/220; 205/223; 205/263; 228/209; 427/343
(58) Field of Search .................... 205/85, 220, 223, 205/263; 427/304, 343, 437; 106/1.14, 1.19, 1.23; 228/208, 209

(56) References Cited

U.S. PATENT DOCUMENTS

| | | | |
|---|---|---|---|
| 4,202,699 A | * | 5/1980 | Kitteridge et al. ........... 430/302 |
| 4,940,181 A | | 7/1990 | Juskey, Jr. et al. |
| 4,978,423 A | | 12/1990 | Dunwirth, Jr. et al. |
| 5,160,579 A | | 11/1992 | Larson |
| 5,173,130 A | | 12/1992 | Kinoshita et al. |
| 5,235,139 A | | 8/1993 | Bengston et al. |
| 5,935,640 A | | 8/1999 | Ferrier et al. |
| 6,183,545 B1 | * | 2/2001 | Okuhama et al. ........... 106/1.18 |
| 6,251,249 B1 | * | 6/2001 | Chevalier et al. ............. 205/80 |

* cited by examiner

*Primary Examiner*—Donald R. Valentine
*Assistant Examiner*—William T. Leader
(74) *Attorney, Agent, or Firm*—Carmody & Torrance LLP

(57) ABSTRACT

A process for enhancing the solderability of a surface, particularly copper surfaces upon printed circuit boards, is disclosed. The surface is plated using a silver plating solution. The plated surface is then further treated with a solution that comprises an organic heterocyclic mercapto compound and most preferably an alkali metal hydroxide.

20 Claims, No Drawings

METHOD FOR ENHANCING THE SOLDERABILITY OF A SURFACE

FIELD OF THE INVENTION

This invention relates generally to a method of treating a surface which treatment enhances the solderability of the surface. The method is particularly useful in the fabrication and assembly of printed circuit boards.

BACKGROUND OF THE INVENTION

Soldering is generally used for making mechanical, electromechanical, or electronic connections to a variety of articles. The distinction between expected functions of the joints is important because each application has its own specific requirements for surface preparation. Of the three soldering applications, making electronic connections is the most demanding.

In the manufacture of electronic equipment utilizing printed circuits, connections of electronic components to the printed circuits are made by soldering of the leads of the components to the through-holes, surrounding pads, lands and other points of connection (collectively, "Areas of Connection"). Typically the connection occurs by wave soldering techniques.

To facilitate this soldering operation, the printed circuit fabricator is required to arrange that the through-holes, pads, lands and other points of connection are receptive to the subsequent soldering processes. Thus these surfaces must be readily wettable by the solder and permit an integral conductive connection with the leads or surfaces of the electronic components. Because of these needs, printed circuit fabricators have devised various methods of preserving and enhancing the solderability of surfaces.

One means of arranging good solderability of the surfaces in question is to provide the surfaces with a pre-coating of solder. In printed circuit fabrication, however, this method has several drawbacks. Since it is not easy to selectively provide these areas with solder, all conductive areas of the board must be solder plated. This can cause severe problems with the subsequent application of solder mask.

Another means of arranging good solderability of these surfaces is to plate them with a final finish coating of a precious metal such as gold, palladium or rhodium. U.S. Pat. No. 5,235,139 (Bengston, et. al.), the teachings of which are incorporated herein by reference, proposes a method for achieving this previous metal final finish. Bengston et al. proposes plating the copper areas to be soldered with electroless nickel-boron, followed by a precious metal coating such as gold. See also U.S. Pat. No. 4,940,181 to Juskey, Jr. et al., the teachings of which are incorporated herein by reference for a similar process which teaches the plating of electroless copper, followed by electrolytic copper, followed by nickel followed by gold as a solderable surface. These processes work well but are time consuming and expensive.

Various attempts have been made to selectively apply solder to the necessary areas only. One such method involves use of organic etch resists over the solder plated areas of connection followed by selective stripping of tin-lead from the copper traces before application of the solder mask. See U.S. Pat. No. 4,978,423 to Durnwith et. al. See also U.S. Pat. No. 5,160,579 to Larson, the teachings of which are incorporated herein by reference, for other known selective solder processes.

Soldering directly to copper surfaces has been difficult and inconsistent. These problems are due mainly to the inability of keeping the copper surfaces clean and free of oxidation throughout the soldering operation. Various organic treatments have been developed to preserve copper surfaces in a readily solderable state. For example, see U.S. Pat. No. 5,173,130 (Kinoshita) which teaches the use of certain 2-alkylbenzimidazoles as copper pre-fluxes to preserve the solderability of the copper surfaces. Treatments such as those taught in Kinoshita have proven successful but there is still need to improve the reliability of the process.

U.S. Pat. No. 5,935,640, the teachings of which are incorporated herein by reference in their entirety teaches a process for improving the solderability of a surface through the use of immersion silver deposits. The immersion silver plating bath used there comprises an imidazole. Generally silver plated surfaces can be stored for some period of time, ranging from about one to sixty days depending upon the storing conditions. As the silver plated surface ages, its solderability tends to get worse.

The present invention proposes a process and plating composition, which improves the storability and solderability of silver plated surfaces. Thus surfaces plated with the composition and process of this invention may be stored for extended periods of time while retaining good solderability characteristics.

SUMMARY OF INVENTION

The present invention proposes a composition and process for treating a surface, particularly a copper or copper alloy surface, in order to enhance and/or preserve the solderability of that surface through immnersion silver plating upon that surface. Specifically the invention proposes plating silver upon the surface through use of an immersion silver plating composition. The surface is thereafter separately contacted with a solution comprising an organic heterocyclic mercapto compound, and optionally but preferably an alkali metal hydroxide. In the alternative, but less preferably, the organic heterocyclic mercapto compound may be incorporated into the silver plating composition, if solubility permits.

DETAILED DESCRIPTION OF THE INVENTION

It has been discovered that immersion silver deposits provide excellent solderability finishes, which are particularly useful in the fabrication of printed circuit boards. It has further been discovered that the long term solderability of silver deposits can be improved by subsequent treatment of the plated silver surface with a composition comprising an organic heterocyclic mercapto compound, and optionally but preferably an alkali metal hydroxide or less preferably by inclusion of the heterocyclic mercapto compound into the silver plating solution, solubility permitting.

Thus the present invention proposes in one embodiment a silver plating solution comprising an organic heterocyclic mercapto compound. In this regard the silver plating solution would typically have the following composition:

a. a soluble source of silver ions;

b. an acid;

c. an organic heterocyclic mercapto compound;

d. optionally, an imidazole;

e. optionally, an oxidant;

f. water

This embodiment may be restricted by the solubility of the organic heterocyclic mercapto compound in the silver plating solution and therefore is less preferable to including the organic heterocyclic mercapto compound in a subsequent treatment step as noted below. In any case the silver plating solution of this invention is preferably an immersion plating solution. Immersion plating is a process which results from a replacement reaction whereby the surface being plated dissolves into solution and at the same time the metal being plated deposits from the plating solution onto the surface. The immersion plating generally initiates without prior activation of the surfaces. The metal to be plated is generally more noble than the surface metal. Thus immersion plating is usually significantly easier to control and significantly more cost effective than electroless plating, which requires sophisticated auto catalytic plating solutions and processes for activation of the surfaces prior to plating.

In the most preferred embodiment of the invention, the original surface is plated using either the silver plating solution noted in the first embodiment (i.e. a silver plating solution comprising an organic heterocyclic mercapto compound) or most preferably a known silver plating solution (i.e. a silver plating solution not comprising an organic heterocyclic mercapto compound). Such known silver plating solutions include MacDermid Sterling™ silver plating solution available from MacDermid, Incorporated 245 Freight Street, Waterbury, Conn. 06702. In either case the then plated silver surface is further contacted with a solution comprising an organic heterocyclic mercapto compound and optionally but preferably an alkali metal hydroxide. Thus the foregoing subsequent treatment solution comprises:

a. an organic heterocyclic mercapto compound
b. optionally, but preferably, an alkali metal hydroxide;
c. water The soluble source of silver ions for use in the silver plating solution can be derived from a variety of silver compounds. Silver nitrate is preferred. The concentration of silver in the plating solution can range from 0.1 to 25 grams per liter, but is most preferably present in a concentration of 0.5 to 2 grams per liter.

Although a variety of acids are suitable for use in the formulation of the silver plating solution, methane sulfonic acid is preferred. The concentration of acid in the plating solution can range from 1 to 150 grams per liter but is preferably in the range of 5 to 50 grams per liter.

Optionally, but preferably the silver plating solution also contains an imidazole or imidazole derivative of the following formula:

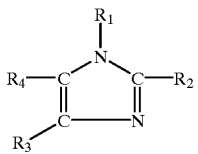

wherein $R_1$, $R_2$, $R_3$ and $R_4$ are independently selected from the group consisting of substituted or unsubstituted alkyl groups, substituted or unsubstituted aryl groups, halogens, nitro groups and hydrogen.

The inclusion of an imidazole as described above brightens the plated deposit. In addition, the imidazole also extends the useful life of the plating solution. The inventors have found that histidine is a particularly preferred imidazole for the purpose of these processes. The inventors have found that silver deposits resulting from plating baths containing imidazoles are brighter, smoother and more cohesive than immersion silver deposits plated from baths which do not have imidazoles. The concentration of imidazole in the silver plating solution may range from 0.1 to 25 grams per liter but is preferably from 1 to 10 grams per liter.

The silver plating compositions useful in the present invention, optionally, advantageously also contain an oxidant. Nitro aromatic compounds, preferably dinitro aromatic compounds, such as 3,5 dinitro hydroxybenzoic acid are preferred in this regard. The concentration of such an oxidant in the solution can range from 0.1 to 25 grams per liter, but is preferably from 0.5 to 2 grams per liter.

In accordance with this invention either the silver plating composition contains an organic heterocyclic mercapto compound, or the plated silver surface is subsequently treated with a separate solution containing an organic heterocyclic mercapto compound or both. As noted, most preferably a surface plated with a standard silver plating bath is subsequently treated with a solution comprising an organic heterocyclic mercapto compound. In either, case preferred organic heterocyclic mercapto compounds include 2-mercaptobenzoxazole, 2-mercaptobenzimidazole, 2-mercaptothiazoline, 2-thiazoline-2-thiol, 2-mercapto-1-alkylimidazole, and 2-mercaptobenzothiazole. The concentration of the organic heterocyclic mercapto compound may range from 0.1 to 50 grams/liter but is preferably from 1 to 10 grams/liter.

If the organic heterocyclic mercapto compound is used in a solution separate from the plating solution to subsequently treat the already silver plated surface, then the separate treatment solution containing the organic heterocyclic mercapto compound also preferably contains an alkali metal hydroxide. In this case, the concentration of the alkali metal hydroxide may range from 0.5 to 100 grams/liter but is preferably from 1 to 10 grams per liter. Sodium hydroxide in a preferred alkali metal hydroxide.

The silver plating solution and/or the subsequent separate treatment solution described herein can be used in the process of the current invention at temperatures ranging from room temperature to 200° F. but are preferably used at from 80 to 120° F. The immersion time in either solution can range from 1 to 30 minutes but is preferably from 1 to 6 minutes.

The silver plating solution is thus used to plate a thin layer of silver onto the surface to be soldered. The resultant silver coating should be from 1 to 100 microinches thick, preferably from 20 to 60 microinches thick for effective enhancement and preservation of the solderability of the surface.

Although the techniques described herein may be utilized advantageously over almost any surface, they are most useful in treating surfaces comprised of copper, nickel, or alloys of either of the foregoing, particularly in the fabrication of printed circuit boards and most preferably in preparing solder mask over bare copper (SMOBC) boards. Thus in fabricating SMOBC boards, the solder mask is applied to the surfaces of the board then exposed and developed to reveal Areas of Connection. These Areas of Connection are then essentially the only exposed areas of copper on the board, with the remainder essentially being covered by solder mask. These Areas of Connection are thus destined to be points of attachment, in most cases by soldering, when the electronic components are placed on the board later in its fabrication cycle. Therefore, the solderability of these exposed points of connection, generally copper, must be enhanced and preserved.

According to the current invention, these areas are preferably cleaned, using an acid cleaner, and subsequently microetched to prepare the surface for acceptable plating. Following the foregoing preferred preparation, the board is immersed in the silver plating solution, such that a silver deposit of appropriate thickness is achieved. preferably, whether or not the silver plating solution contains an organic heterocyclic mercapto compound, the silver plated surface is then contacted with a treatment solution comprising an organic heterocyclic mercapto compound, and preferably alkali metal hydroxide as noted.

The invention is further described for illustrative purposes only in the following examples, which are in no way limiting of the invention itself.

EXAMPLE I

Comparative

Standard FR-4 copper clad epoxy laminate was drilled with an array of holes. The holes were plated through a well known process with an acid electrolytic copper plating process such that the surfaces of the holes and the other surfaces of the laminate were plated with approximately 2.5 microns of copper. The foregoing laminate was then cut into several coupons, which were each plated with silver using the following silver plating process:

silver nitrate—1 g/liter
methane sulfonic acid (70%)—20 ml/liter
3,5 dinitrohydroxybenzoic acid—1 g/liter
1—histidine—1 g/liter
water to 1 liter
temperature—100° F.
time—5 minutes The coupons were artificially aged for 18 hours in a closed environment over a solution containing 1% sulfuric acid and 1 g/l sodium sulfide (nine hydrate). The coupons were then floated over molten solder at 450° F. for 10 seconds and examined for solderability. Solderability was evaluated as a ratio of the number of holes which were completely filled or covered with solder to the total number of holes (expressed as a percentage).

In this case only 1.9% of the holes in the coupons were filled with or completely covered with solder.

EXAMPLE II

Example I was repeated except that this time the coupons were treated, after plating in the silver plating solution and before artificial aging, in the following treatment solution:

| | |
|---|---|
| 2-mercaptobenzimidazole | 6 g/liter |
| sodium hydroxide | 7.7 g/liter |
| water to 1 liter | |
| temperature 55° C. | |
| treatment time-2 minutes | |

In this case 95.9% of the holes in the coupons were filled with or completely covered with solder.

EXAMPLE III

Example I was repeated except that this time the coupons were treated, after plating in the silver plating solution and before artificial aging, in the following treatment solution:

| | |
|---|---|
| 2-mercaptobenzothiazole | 5 g/liter |
| sodium hydroxide | 6 g/liter |
| treatment temperature | 50° C. |
| treatment time | 1 minute |

In this case 97.8% of the holes in the coupons were filled with or completed covered with solder.

What is claimed is:

1. A process for enhancing the solderability of a surface, which process comprises plating a deposit of silver onto the surface using a silver plating solution which silver plating solution comprises an organic heterocyclic mercapto compound and an imidazole.

2. A process according to claim 1, wherein the surface is a material selected from the group consisting of copper, nickel, and alloys of either of the foregoing.

3. A process according to claim 1, wherein the surface is an area upon a printed circuit board.

4. A process according to claim 1, wherein the silver is plated to a thickness of from 1 to 100 microinches.

5. A process according to claim 1, wherein the organic heterocyclic mercapto compound is selected from the group consisting of 2-mercaptobenzoxazole, 2-mercaptobenzimidazole, 2-mercaptothiazoline, 2-mercapto-1-alkylimidazole, and 2-mercaptobenzothiazole.

6. A process according to claim 5, wherein the surface is a material selected from the group consisting of copper, nickel and alloys of either of the foregoing.

7. A process according to claim 5, wherein the silver plating solution also comprises a nitro aromatic compound.

8. A process according to claim 7, wherein the surface is a material selected from the group consisting of copper and copper alloys.

9. A process according to claim 5, wherein the surface is a material selected from the group consisting of copper and copper alloys.

10. A process according to claim 1, wherein the silver plating solution also comprises a nitro aromatic compound.

11. A process according to claim 1, wherein the surface is a material selected from the group consisting of copper and copper alloys.

12. A process for enhancing the solderability of a surface, which process comprises plating a deposit of silver onto the surface and thereafter contacting the silver deposit with a solution comprising an organic heterocyclic mercapto compound.

13. A process according to claim 12, wherein the surface is a material selected from the group consisting of copper, nickel and alloys of either of the foregoing.

14. A process according to claim 12, wherein the solution also comprises an alkali metal hydroxide.

15. A process according to claim 12, wherein the organic heterocyclic mercapto compound is selected from the group consisting of 2-mercaptobenzoxazole, 2-mercaptobenzimidazole, 2-mercaptothiazoline, 2-mercapto-1-alkylimidazole, and 2-mercaptobenzothiazole.

16. A process according to claim 15, wherein the surface is a material selected from the group consisting of copper, nickel and alloys of either of the foregoing.

17. A process according to claim 15, wherein the solution also comprises an alkali metal hydroxide.

18. A process according to claim 17, wherein the surface is a material selected from the group consisting of copper, nickel and alloys of either of the foregoing.

19. A process according to claim 18, wherein the surface is a material selected from the group consisting of copper and copper alloys.

20. A process according to claim 12, wherein the surface is a material selected from the group consisting of copper and alloys.

* * * * *